United States Patent
Reasor

(10) Patent No.: US 6,643,812 B1
(45) Date of Patent: Nov. 4, 2003

(54) MANIPULATION OF HARDWARE CONTROL STATUS REGISTERS VIA BOUNDARY SCAN

(75) Inventor: Jason W. Reasor, Plano, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/563,001

(22) Filed: Apr. 29, 2000

(51) Int. Cl.[7] .................................................. G01R 31/28
(52) U.S. Cl. ...................................................... 714/727
(58) Field of Search ................................. 714/721, 724, 714/726–729, 30, 25.1, 731–734, 738–739; 324/763, 765, 158.1; 716/4, 1

(56) References Cited

U.S. PATENT DOCUMENTS 5,841,792 A * 11/1998 Kawano et al. ............. 714/733
6,389,565 B2 * 5/2002 Ryan et al. .................. 714/724
6,430,718 B1 * 8/2002 Nayak ......................... 714/727

* cited by examiner

Primary Examiner—Albert Decady
Assistant Examiner—Guy Lamarre

(57) ABSTRACT

A method and system for injecting scanned data into rings located in different system devices comprises configuring a utility buffer from a specified scan path by combining one or more fields from a database having one or more fields, locking a specified ring on each devices specified on the desired scan path, allowing a desired value to be written concurrently into the same fields of the devices, and allowing the utility buffer to be written back to interposed status registers of the one ring in each of the devices to cause the data in the status registers to be scanned out for reading into the fields of the utility buffer.

20 Claims, 5 Drawing Sheets

MANIPULATION OF HARDWARE CONTROL STATUS REGISTERS VIA BOUNDARY SCAN

TECHNICAL FIELD

This invention relates to scanning data into and out of control status register locations in a system comprising digital devices.

BACKGROUND

Boundary scanning is a way of reading and writing data into and out of control status register locations in a system comprising digital devices. FIG. 1 shows a chain of devices. The chain includes an input port and an output port. The input port allows data to be scanned into the chain of devices. The output port allows data to be read from the chain. Each device has one or more rings. Each ring consists of one or more memory registers. Each ring provides a path for data to enter and exit the device. As data enters at one end of the ring, data leaves at the other end of the ring. Only one ring in a device can be open at a time. The combination of open rings on a group of devices constitutes a scan path.

Rings can have different lengths. The sum of the lengths of open rings is the length of the scan path. For example, in FIG. 1 ring 25 on device 20A could have a length of 16 bits, ring 25 in device 20B could be 32 bits long, and ring 25 on device 20C could be 64 bits long. The scan path length would then be 112 bits. To test these rings a 112 bit wide chain of bits is scanned in at the input port and the scan chain outputs a 112 bit wide chain of data at the output port. This normally would require successive read/write operations to accomplish the scan. This is ineffective for many diagnostic purposes because in many cases the writing of data in one ring will affect the data in another ring before it can be read, making it impossible to ascertain the state of the rings prior to the scan. According to methods of the prior art, data can be written into and read from a ring of each of multiple similar devices in the same scan chain in a single scan operation provided that the same ring in each device is open. But this is a severely limited test operation, that fails to enable an adequate diagnosis of the operation of a system.

Therefore, what is needed are systems and methods for overcoming these and other obstacles not overcome by the prior art.

SUMMARY OF THE INVENTION

The present invention provides methods and systems that overcome the obstacles not overcome by prior art methods and systems. The present invention enables a user to inject data into different rings in multiple devices in a single scan operation. The invention provides a utility buffer that enables a user to write test data to be injected into each of a plurality of rings, one ring in each of a plurality of devices. The buffer consists of a plurality of fields for entering the test data to be injected into the rings, each field corresponding to the one or more registers in the plurality of rings. The test data is injected into the registers in a single scan operation. Test data is also read from the registers in a scan operation into a set of fields, each field corresponding to a register. This enables the user to read data from all of the rings as the data existed prior to the scan. The present invention enables the user to specify, prior to the scan operation, each device and the ring within each device to be scanned in the scan operation. Thus, according to the present invention, the utility buffer comprises a memory construct of fields, each field corresponding to a different register in a ring for each ring in a device for each device in a system for one or more systems to be tested. To set up a scan operation, the user specifies the system or systems to be tested, each device within each system, and the ring within each device to be tested. The database system then associates the corresponding fields to construct a chain of fields for which the test data may be entered for each bit of each register to which the field corresponds.

These and other features and aspects of the present invention may be better understood with reference to the following figures and written description of examples.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWING

For a more complete understanding of the present invention, and the advantages thereof, reference is now made to the following descriptions taken in conjunction with the accompanying drawings, in which.

DETAILED DESCRIPTION

Figure 1:
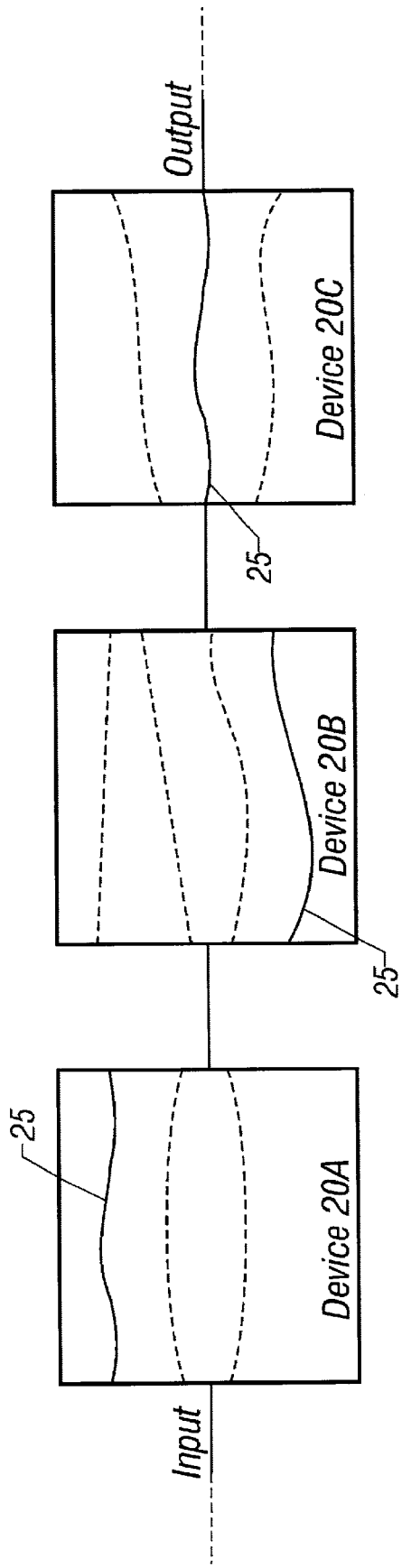
FIG. 1 is an illustration of devices in a scan chain each having a plurality of rings.
Figure 2:
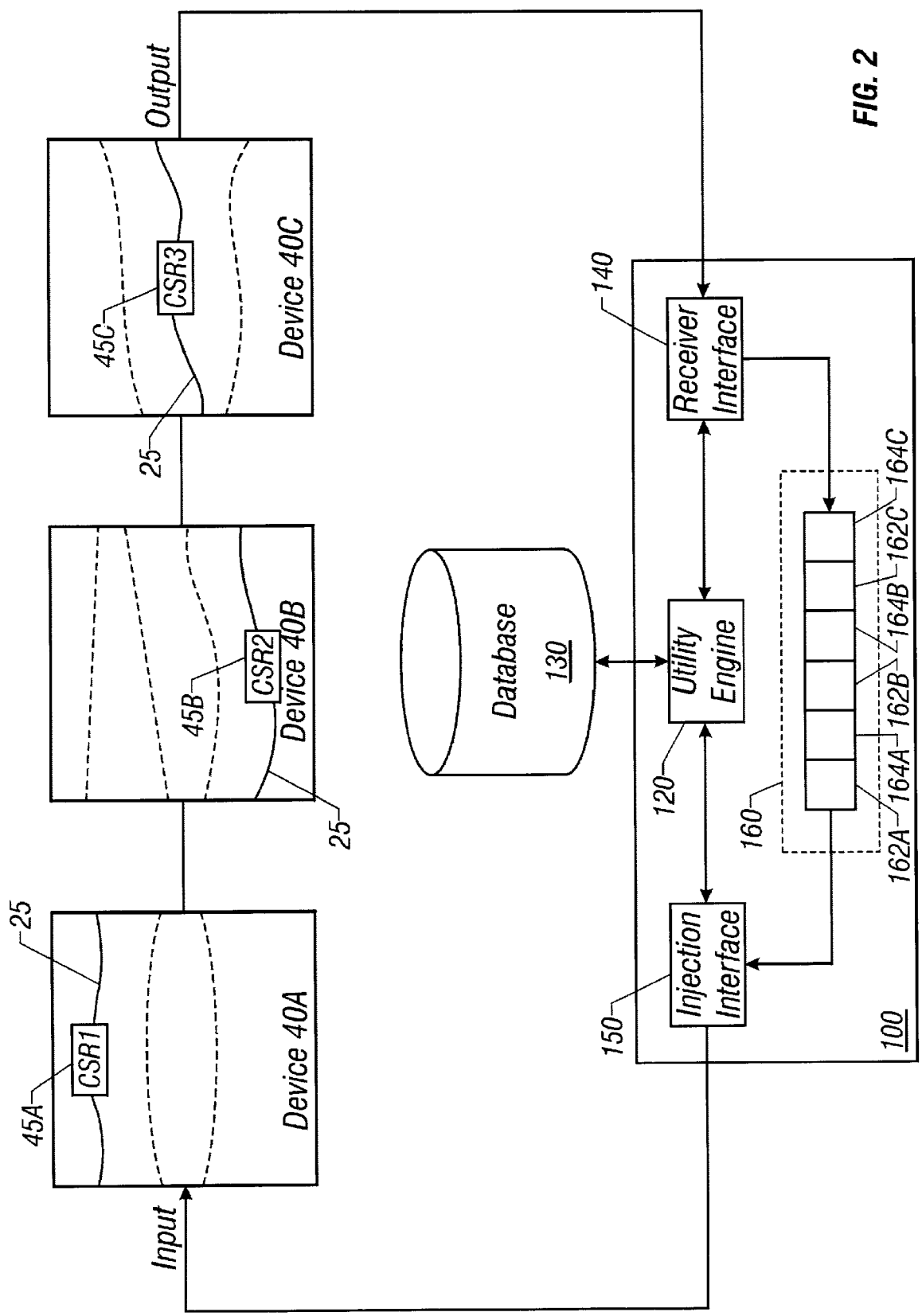
FIG. 2 is an illustration of an embodiment of the present invention.

FIG. 2 is an illustration of an embodiment of the present invention shown as a utility system 100. Connected to system 100 are a plurality of devices 40A, 40B, 40C in a scan chain. Each device comprises a plurality of rings 25. Each ring comprises one or more status registers 45. System 100 comprises an injection interface 150 for injecting data into the scan chain and a receiver interface 140 for receiving data from the scan chain. A database 130 provides a set of fields, one field for each register of each ring for each device in one or more sets of devices to be accessed. Utility engine 120 enables a user to select a scan path through a scan chain by enabling the user to specify which registers of which rings of which devices in the one or more sets of devices are to be accessed. For each field to be accessed, utility engine 120 also enables the user to specify the value of each bit in each specified field. These fields are then associated in the order that the fields occupy in the scan path.

When a user selects the devices and the ring within each device for a data scan operation, utility engine 120 constructs an instruction scan operation by assembling an ordered sequence of fields that are transmitted through a chain of instruction rings, one instruction ring for each device in the user-selected scan path. The instruction scan operation provides an instruction to the instruction ring of each device that directs the device to open the specified ring. Then a scan operation commences for transmitting data in an ordered sequence of fields to the opened rings and for receiving data from the opened rings. Thus, a user may select a set of fields corresponding to a set of status registers to which test data is to be injected. The user may then specify the value of each bit in each field. The fields corresponding to the status registers in the selected scan path are combined to form a set of scan data. The set of scan data corresponding to the status registers interposed in the selected scan path is then transmitted by utility engine 120 to injection interface 150. Utility engine 120 enables the user to initiate a scan operation, in which the set of fields is injected into the scan path through the open rings of each device and written into the set of status registers to which the set of fields correspond.

Similarly, a scan operation can be initiated for receiving data from the scan path and storing the data in a set of fields corresponding to the interposed set of registers in the scan path from which the data is received. When the data is received, the user may view the data and selectively alter all of or any subset of bits in the set of fields. The user may then initiate a scan operation to write the altered data to the status registers in the scan path.

A utility buffer 160 consists of the set of fields corresponding to the interposed set of status registers in the selected scan path. For example, fields 162A and 164A correspond to two status registers in a selected ring in a first device of a scan chain. Fields 162B and 164B correspond to two status registers in a selected ring in a second device of a scan chain. Fields 162C and 164C correspond to two registers in a selected ring in a third device of a scan chain. Each of these status registers can be of different length and some or all of them can be of the same length, wherein the length refers to the number of bits in the field. By specifying which rings of which devices are to be accessed, the user causes utility engine 120 to construct utility buffer 160, based on information obtained from database 130, comprising a set of fields, with each field having a length equal to the number of bits in the status register to which the field corresponds. In one embodiment, utility buffer 160 is configured using an addressable memory in utility system 100. The fields can be interleaved. For example, they, fields can be scattered or overlapping one another. The user may write to any bit of any field in order to construct a desired test data sequence to be injected into the scan path. For example, an exemplary ring of length 16 (R0–R15 bits) comprises field A, field B, and field C. The three fields are of different lengths. The length of field A is eight (FA0–FA7 bits). Similarly, the length of filed B is seven (F0–FB6 bits) and the length of field C is one (FC0 bit). In the exemplary ring, the bits of the three fields in a configuration with field A bits FA0–FA7 can be arranged in ring bits R0–R3, R9, R11, R14, R15. In addition, for field B bits FA0–FA7 in ring bits R4–R7, R10, R12, and R13. Finally, for field C bit FC0 in ring bit R8.

Figure 3:
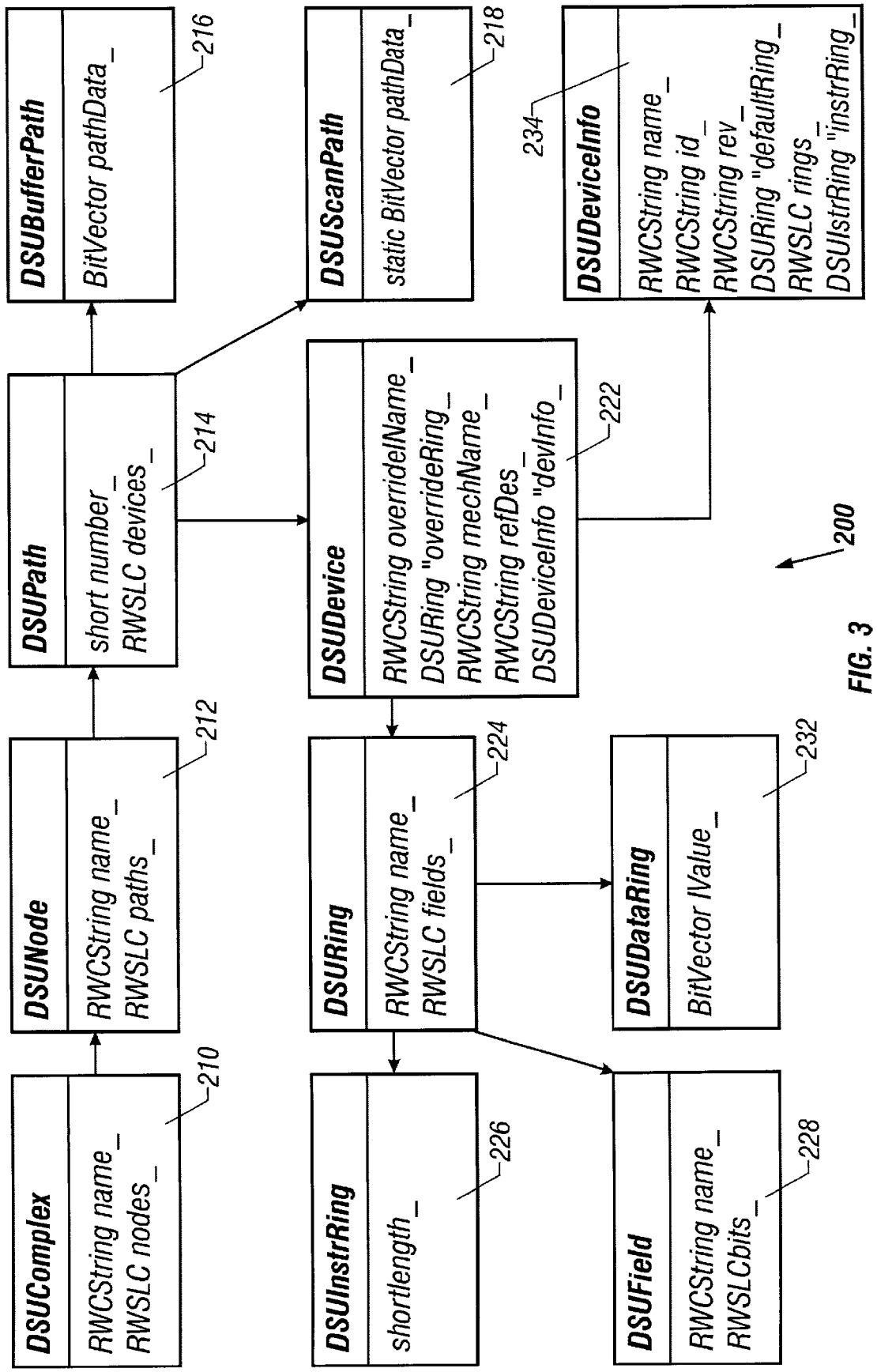
FIG. 3 is an illustration of an embodiment of a database hierarchy according to the present invention.

FIG. 3 is an illustration of an embodiment of a database hierarchy 200 according to the present invention. In one embodiment, the database hierarchy is an object-oriented model comprising objects. A system to be tested may comprise, for example, a supercomputer that has multiple boards with hundreds of devices such as processors and controller chips. Several of such systems could be chained together to form a larger system called a node, which may be combined into a complex of nodes. An object 210 represents a complex, which specifies a set of nodes. An object 212 represents a node, which specifies a set of paths. An object 214 represents a path, which specifies a set of devices and path types. An object 216 specifies a buffer path. An object 218 specifies a scan path. An object 222 represents a device and specifies device information 234 and rings. An object 224 specifies a ring and a ring type. An object 226 specifies an instruction ring. An object 232 specifies a data ring. An object 228 specifies a field.

Figure 4A:
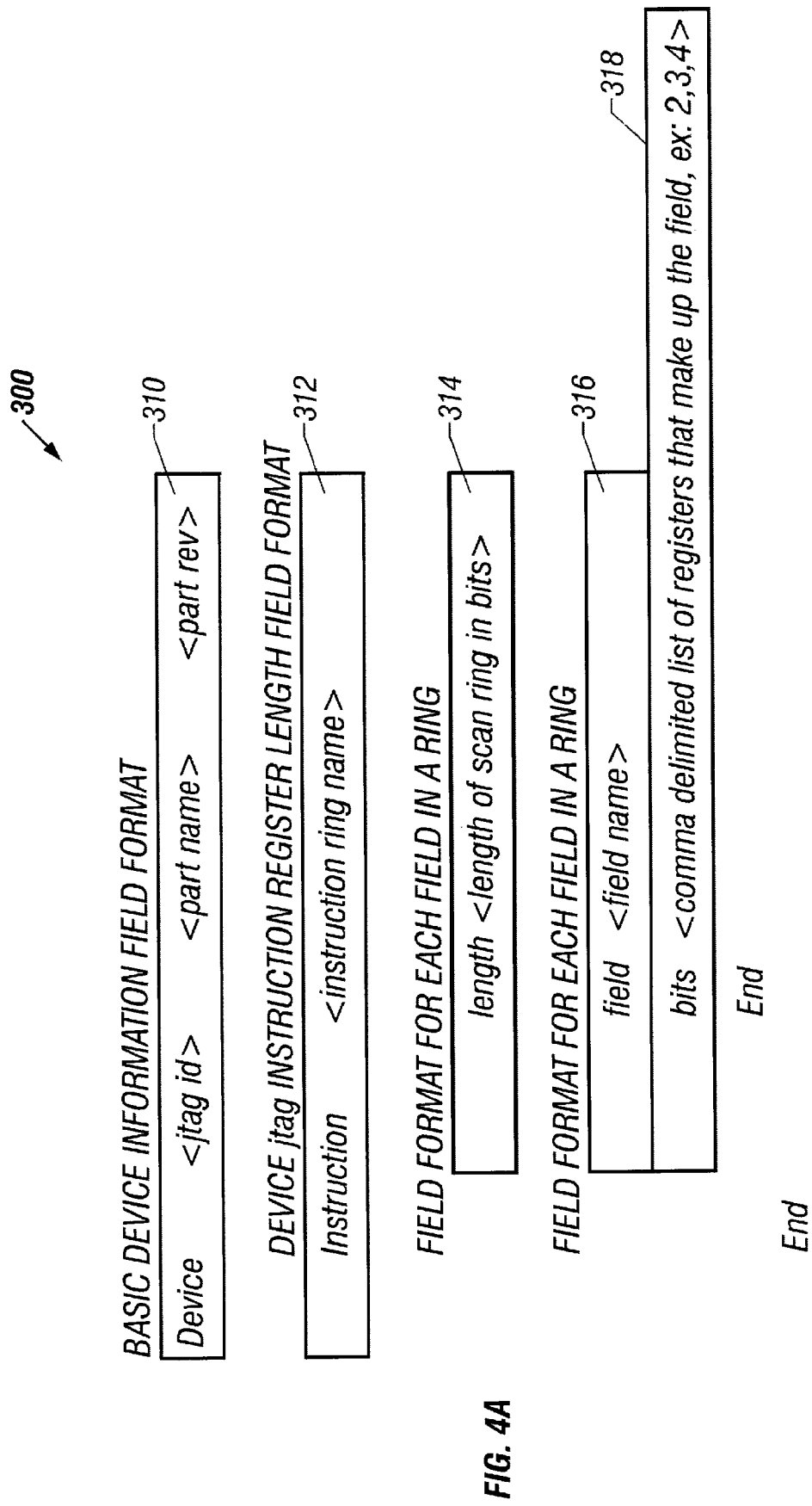
FIG. 4A shows a portion of one embodiment of a field map file employed to map status registers on scan rings to user accessible fields.
Figure 4B:
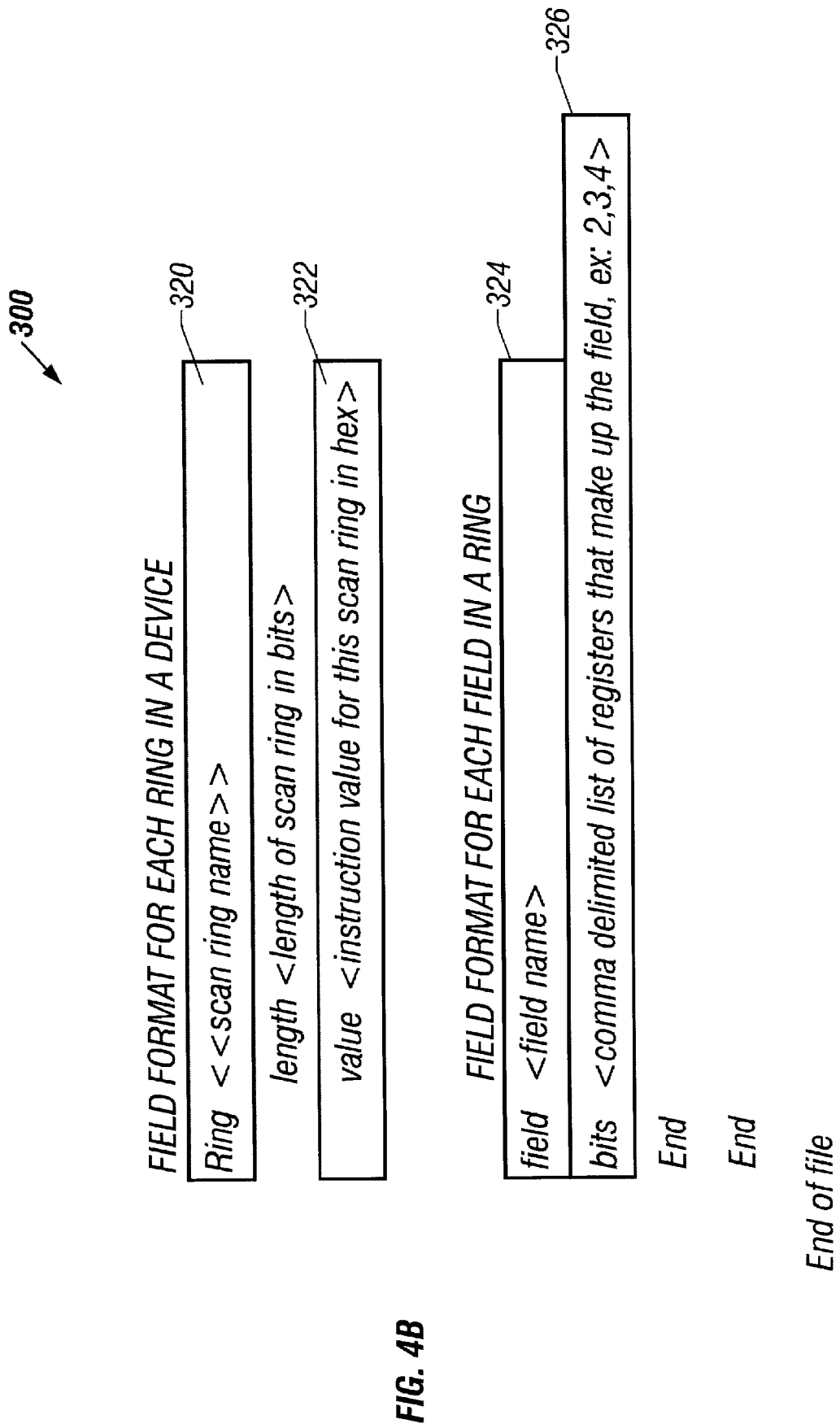
FIG. 4B shows the remaining portion the one embodiment of the field map file of FIG. 4A.

FIG. 4A shows a portion of one embodiment of a field map file 300 employed to map status registers on scan rings to user accessible fields. FIG. 4B shows the remaining portion the one embodiment of the field map file 300 of FIG. 4A. FIGS. 4A and 4B in combination show one complete embodiment of field map file 300 employed to map status registers on scan rings to user accessible fields. Field map file 300 is stored in database 130 for each device. A first entry 310 in field map file 300 identifies the device. A second entry 312 identifies the instruction ring for the device and the length of the instruction ring in bits is indicated by entry 314. For each field in the instruction ring a field name entry 316 and register bit list entry 318 is provided. For each ring in a device a ring name entry 320, a ring length and ring instruction value 322 is provided. For each field in a scan ring of the device a field name entry 324 and a register bit list entry 326 is also provided.

A user may access the bits of a field by specifying a target string. The target string identifies the complex, the node, the path, the device, the ring and the field. An example of a target string is as follows:

complex1:node1:path0:device3:ring2:field1 which specifies field 1 of ring 2 of device 3 of path 0 of node 1 of complex 1. Specification of the target string causes the bits of the targeted field to be readable and writeable by the user. The use of wild cards in a target string enables access to multiple fields with a single target string. For example, a system may comprise multiple similar controllers designated as alpha1, alpha2, alpha3, etc. A user may write all "ones" to each field in a buffer corresponding to a register in each device with one target string:

>>bput alpha*.ring1:field0 0xf where bput is a write command that causes the specified data to be written to the specified field or fields in buffer 160. In this case 4 ones are written to field0 of ring1 of every device alpha1, alpha2, alph3, etc.

The present invention provides various commands for performing different functions associated with scan operations. For example, suppose a user wishes to inject data into two similar "alpha" devices on a scan chain consisting of the two alpha devices and two "beta" devices. First, the user enters a command to lock the scan path so that the data in the registers in the scan path cannot change during the scan operation. Then the user enters a command to write data into the desired buffer fields of the alpha devices. The user then enters an unlock command to release the locked registers. The sequence of commands would be as follows:

>>block complex1:node1:path1:alpha*.ring1

This command locks ring1 on all of the devices that start with the keyword "alpha" on path 1.
This command is followed by:

>>bput alpha*.ring1:field0 0xf

This command writes all ones to the four bits of field0 of ring1 in both of the alpha device buffers. This command is followed by:

>>bput beta*:ring1:field1 0xff

This command writes all ones to the eight bits of field1 of ring1 in both of the beta device buffers. This command is followed by:

>>bunlock

This command unlocks the buffer and writes the buffer out to the hardware.

When a "block" command is issued, the specified scan path object is assigned a data buffer which accurately portrays the data that is currently in the devices on that scan path. The user can then write data to this buffer through the use of bput commands (he can also read data from the buffer through bget commands). When the user is done manipulating the data, he issues a bscan command to scan the data out and leave the buffer locked for future use or issue a bunlock command to unlock the buffer and scan the data out. At any time, the user can issue a bcancel command to unlock a data buffer without scanning data out.

The syntax of various commands for controlling buffer 160 and the data therein are now described.

block <-data_read on |off-errors on |off-h><target_string>
  Locks a specified buffer in test station memory for manipulation
    where target string=complex:node:path:device:ring
    -errors on |off: specifies whether errors are reported to the screen. By default, this option is on.
    -h: print help info for this command
    notes: This command will read the scan path specified and store it in the buffer. It will also lock this ring so no other scan operation can update it until it is unlocked. If the user does not want to read the buffer, simply allocate memory representing it, that is, -data_read off is set.

bput<errors on |off:-h><target_string><value>
  Writes a value to a field in the locked buffer. This command does not write actual data out to hardware until a 'bunlock' or 'bscan' is issued
    where target string=complex:node:path:device:ring
    value=hex value of data to put in the field (e.g. 0xf1b)
    -errors on |off: specifies whether errors are reported to the screen. By default, this option is on.
    -h: print help info for this command
    notes: a bput command will not write the data out to the scan path until a bscan or bunlock is performed. This command will put a field into the lock buffer created by the block command.

bget<-errors on |off:-h><target_string>
  Reads a value from a field in the locked buffer. This command does not read actual data from the hardware. It reads values stored in the locked buffer.
    where target_string=complex:node:path:device:ring
    -errors on |off: specifies whether errors are reported to the screen. By default, this option is on.
    -h: print help info for this command
    notes: This command will read and display a field out of the lock buffer created by the block command.

bunlock<-errors on |off:-h><target_string>
  Unlocks the locked data buffer and write the locked buffer out to the specified scan path.
    where target_string=complex:node:path:device:ring
    -errors on |off: specifies whether errors are reported to the screen. By default, this option is on.
    -h: print help info for this command
    notes: bunlock writes the data out to the scan path and unlocks the scan path.

This command will write the lock buffer image back to the device from which it was read. It will then unlock the ring so other scan operations can access it.

The following commands enable reading and writing data to device registers.

get complex:note:path:part:ring:field
  This command will return the data for the specified field.

put complex:note:path:part:ring:field:value
  This command will read the scan ring specified, update the correct field and write the scan ring back to the device.

ir_put [-w] complex:node:path:part:tap_instruction
  This command will write the specified instruction into the instruction ring on the specified part.

The following commands will set, show, and update default instructions and ring values for devices in the system.

seti part:instruction
  This command will store an instruction as the default instruction to use for the given part or device. This only stores this information in the database.

showi part
  This command will display the current default instruction value for the specified part.

defaulti part
  This command will reset the default instruction value for the given part. The default value is given as part of the field input file.

setr part: ring
  This command will set a default ring for the specified part. This default is stored in the information database for future scan operations.

showr part
  This command will display the current default ring selection for the specified part.

defaultr part
  This command will reset the default ring selection for the specified part. This default value is given as part of the field input file.

A more detailed description of functions provided and the syntax of instructions for implementing the functions is now described.

```
get <-i on|off -errors on|off -fieldparth [0-2] -h> <target_string>
    Returns a the hex value stored in a specified field.
    where target string = complex:node:path:device:ring:field
    -i on|off:       specifies whether or not an instruction write is
                     done before a data read. This is useful if
                     multiple scans are needed on the same part. By
                     default, this option is on.
    -fieldpath [0-2]: specifies how much of the target string to print
                     out on the screen
                 0:  print all terms and return value (default)
                 1:  print field name and return value only
                 2:  print return value only
    -errors on|off:  specifies whether errors are reported to the
                     screen. By default, this option is on.
    -h:  print help info for this command
put <-i on|off -data_read on|off -e [END_STATE] -errors on|off -h>
    <target_string> <value>
    Writes a hex value out to a field.
    where target string = complex:node:path:device:ring:field
    -i on|off:       specifies whether or not an instruction write is
                     done before a data read. This is usefull if
                     multiple scans are needed on the same part. By
                     default, this option is on.
```

```
-continued

-data read on|off:    specifies whether or not a data read is per-
                      formed before a data write is performed. If
                      off, bits that are not explicitly being set
                      by the put value are set to 0. By default,
                      this option is on. This option is mainly used for
                      boundary ring puts to protect the integrity of
                      the data already out on the path.
-e [END_STATE]:       allows the user to leave the jtag controller
                      state machine in a specific state. The
                      default is the RUN-TEST-IDLE state.
                      Other options might be PAUSE-IR or
                      PAUSE_DR. If the -e option
                      specifies a JTAG_RESET
                      then the controller is reset after the
                      command is executed.
-errors on|off:       specifies whether errors are reported to the screen.
                      By default, this option is on.
-fieldpath [0-2]:     specifies how much of the target string to print
                      out to the screen.
              0:      print all terms and return value (default)
              1:      print field name and return value only
              2:      print return value only
-h:   print help info for this command
ir_put <-errors on|off -h> <target_string> <value>
    Writes a hex value out to the instruction ring of a device.
    where target string = complex:node:path:device
    value  =  hex value of data to put in the field (e.g. 0xf1b)
    -errors on|off:   specifies whether errors are reported to the screen.
                      By default, this option is on.
    -h:   print help info for this command
ir_get <-errors on|off -h> <target_string> <value>
    Reads the instruction ring of the specified device (could
    return monitor bits).
    where target string = complex:node:path:device
    -errors on|off:   specifies whether errors are reported to the screen.
                      By default, this option is on.
    -h:   print help info for this command
block <-data_read on|off -errors on|off     -h> <target_string>
Locks a specified buffer in test station memory for manipulation
    where target string = complex:node:path:device:ring
    -errors on|off:   specifies whether errors are reported to the screen.
                      By default, this option is on.
    -h:   print help info for this command
    <-data_read on|off -errors on|off:  specifies whether or not a data
    read                      is performed before a data write is performed. If off,
                              bits that are not explicitly being set by the put
                              value are set to 0. By default, this option is on.
                              This option is mainly used for boundary ring puts
                              to protect the integrity of the data already out
                              on the path.
    -errors on|off:   specifies whether errors are reported to the screen.
                      By default, this option is on.
    -h:   print help info for this command
    notes: only one ring can be specified. Since a block reads in one
           ring from each device on the scan path, wildcards are not
           supported in the ring token. If more than one ring on a path
           needs to be specified, this should be accomplished
           through the use of seti or setr.
bscan <-errors on|off:          -h> <target_string>
    Writes the locked buffer out to the specified scan path, but do not
    unlock the buffer.
    where target string = complex:node:path:device:ring
    -errors on|off:   specifies whether errors are reported to the screen.
                      By default, this option is on.
    -h:   print help info for this command
    notes: bscan writes the data out to the scan path, but does not
           unlock the scan path.
bcancel <-errors on|off:        -h> <target_string>
    Unlocks the locked buffer and do not write data out to the specified
    scan path.
    where target string = complex:node:path:device:ring
    -errors on|off:   specifies whether errors are reported to the screen.
                      By default, this option is on.
    -h:   print help info for this command
    notes: bcancel cancels all previous buffer operations performed on
           the path without writing the data out to the scan path.
binfo <-errors on|off:          -h> <target_string>
    Reports information on the locked buffer.
    where target string = complex:node:path:device:ring
```

```
-continued

-errors on|off:   specifies whether errors are reported to the screen.
                      By default, this option is on.
    -h:   print help info for this command
    notes: binfo shows information on the devices and rings
           locked in the specified scan path.
seti <-errors on|off:           -h> <target_string> <value>
    Sets the default instruction value of a device to specific hex value.
    where target string = complex:node:path:device:ring
    value  =  the instruction mode to be used for this device
              (e.g. 0x02)
    -errors on|off:   specifies whether errors are reported to the screen.
                      By default, this option is on.
    -h:   print help info for this command
showi <-errors on|off           -h> <target_string>
    Shows the default instruction value of a device.
    where target string = complex:node:path:device
    -errors on|off:   specifies whether errors are reported to the screen.
                      By default, this option is on.
    -h:   print help info for this command
defaulti <-errors on|off:       -h> <target_string>
    Resets the device to its default instruction value (BYPASS)
    where target string = complex:node:path:device
    -errors on|off:   specifies whether errors are reported to the screen.
                      By default, this option is on.
    -h:   print help info for this command
    notes: resets the device's instruction mode to its default
           value (usually BYPASS)
setr <-errors on|off:           -h> <target_string>
    Sets the default instruction ring of a specified device.
    where target string = complex:node:path:device:ring
    -errors on|off:   specifies whether errors are reported to the screen.
                      By default, this option is on.
    -h:   print help info for this command
    notes: sets the instruction node for the device to the one
           specified by the ring.
showr <-errors on|off:          -h> <target_string>
    Sets the default instruction ring of a specified device.
    where target string = complex:node:path:device:ring
    -errors on|off:   specifies whether errors are reported to the screen.
                      By default, this option is on.
    -h:   print help info for this command
defaultr <-errors on|off:       -h> <target_string>
    Resets the device to the default instruction ring (BYPASS).
    where target string = complex:node:path:device
    -errors on|off:   specifies whether errors are reported to the screen.
                      By default, this option is on.
    -h:   print help info for this command
    notes: resets the device's instruction mode to its default
           value (usually BYPASS)
list <-fieldpath [0|1]          -h  <target_string>
    Lists the fields in a specified ring.
    where target string = complex:node:path:device
    -fieldpath [0|1]:     specifies how much of the target string to
                          print out to the screen
                  0:      print all terms (default)
                  1:      print field name only
    -h:   print help info for this command
    notes: list will print out all fields on a specified ring.
```

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for injecting scanned data into a plurality of rings, each such ring being located in a different system device, each ring having one or more registers, each register corresponding to one or more database fields and wherein a plurality of said devices comprise a scan path, and wherein each ring is selected from a plurality of possible rings, the method comprising:

configuring a utility buffer for a specified scan path by combining one or more fields from a database having the one or more fields;

locking one specified ring on each of a plurality of devices specified on said specified scan path;

allowing a desired value to be written concurrently into the one or more fields that correspond to the each of the plurality of devices; and allowing the utility buffer to be written back to by the one or more interposed status registers of the one specified ring in each of the plurality of devices to cause the data in the status registers to be scanned out for reading into the fields of the utility buffer.

2. The method of claim 1, further including the step of evaluating the read scanned data for assessing the one ring from each of the plurality of devices.

3. The method of claim 1, wherein the one specified ring is a different ring for each of the plurality of devices.

4. The method of claim 1, wherein said configuring step includes using a target string to access one or more bits in the one or more fields.

5. The method of claim 1, wherein said allowing a desired value to be written concurrently into the one or more fields step is accomplished through a single scan operation.

6. The method of claim 4, wherein the specified ring identifies a complex, a node, a path, a device, a ring, and a field.

7. The method of claim 5, wherein the scan path is specified through a buffer oriented command set.

8. A method for testing a desired scan path in a plurality of devices, the scan path having one ring from each of the plurality of devices with each ring having an interposed status register, the method comprising:

writing test data to be injected into the status registers into a utility buffer having one or more fields corresponding to the status registers;

injecting the test data into the status registers, wherein the test data is scanned from the one or more fields into the status registers; and reading the test data from the status registers, wherein the test data is scanned from the status registers into the one or more fields.

9. The method of claim 8, further including the step of evaluating the read test data to assess the rings.

10. The method of claim 8, wherein said injecting step is accomplished through a single scan.

11. The method of claim 8, further comprising the steps of:

initially specifying the desired scan path; and configuring the utility buffer for the specified scan path by combining the one or more fields from a database having a plurality of fields.

12. The method of claim 11, wherein said configuring step further comprises the step of:

using a target string to access one or more bits in the one or more fields.

13. The method of claim 8, further comprising the step of:

locking the one ring on the each of the plurality of devices specified on the desired scan path.

14. The method of claim 13, wherein the scan path includes a complex, a node, a path, a device, a ring, and a field.

15. A utility system for testing a desired scan chain in a plurality of devices, the scan chain having one ring from each of the plurality of devices with each ring having an interposed status register, the system comprising:

a database having a field object model for creating fields that correspond to the status registers; and a utility engine operably connected to the database for configuring a utility buffer from the fields, wherein the utility buffer is configured for the desired scan chain and has fields that correspond to the status registers from the scan chain;

wherein the utility engine is operably connected to the scan chain for injecting in a single scan data from the utility buffer into the scan chain.

16. The system of claim 15, further comprising:

an injection interface for injecting data into the desired scan chain; and a receiver interface for receiving data from the scan chain.

17. The system of claim 16, wherein the utility engine enables a user to specify a value of each bit in each specified field.

18. The system of claim 15, wherein each of the plurality of devices further comprises a plurality of rings.

19. The system of claim 15, wherein each of the one rings comprises a plurality of interposed status registers.

20. The system of claim 15, wherein the utility engine enables a user to select a scan path through a scan chain by enabling the user to specify which registers of which rings of which devices in the plurality of devices to be accessed.

* * * * *